United States Patent [19]

Siwinski

[11] Patent Number: 5,537,294
[45] Date of Patent: Jul. 16, 1996

[54] PRINTED CIRCUIT CARD HAVING A CONTACT CLIP FOR GROUNDING A PRINTED CIRCUIT BOARD FOUND THEREIN

[75] Inventor: Paul P. Siwinski, Seminole, Fla.

[73] Assignee: The Whitaker Corporation, Wilmington, Del.

[21] Appl. No.: 252,512

[22] Filed: Jun. 1, 1994

[51] Int. Cl.[6] .................................................. H05K 5/00
[52] U.S. Cl. .................... 361/753; 439/96; 361/818; 235/380; 235/492
[58] Field of Search .......................... 361/737, 753, 361/816, 818; 174/35 R, 35 MS, 35 GC; 235/380, 492; 439/92, 95–96; 24/293, 295–296

[56] References Cited

U.S. PATENT DOCUMENTS

| | | | |
|---|---|---|---|
| 3,680,038 | 7/1972 | Johnson | 339/65 |
| 4,060,889 | 12/1977 | Zielinski | 29/628 |
| 4,755,147 | 7/1988 | Young | 439/77 |
| 4,773,878 | 9/1988 | Hansell, III | 439/497 |
| 4,808,118 | 2/1989 | Wilson et al. | 439/95 |
| 4,889,959 | 12/1989 | Taylor et al. | 174/35 GC |
| 4,925,400 | 5/1990 | Blair et al. | 439/374 |
| 4,938,702 | 7/1990 | English | 439/67 |
| 5,031,076 | 7/1991 | Kiku | 361/753 |
| 5,138,529 | 8/1992 | Colton et al. | 361/424 |
| 5,286,214 | 2/1994 | Takahashi | 439/159 |
| 5,288,247 | 2/1994 | Kaufman | 439/607 |
| 5,333,100 | 7/1994 | Anhalt et al. | 361/737 |

FOREIGN PATENT DOCUMENTS

| | | | |
|---|---|---|---|
| 1016773 | 10/1957 | Germany | 174/35 GC |

*Primary Examiner*—Bot L. Ledynh
*Attorney, Agent, or Firm*—Kevin D. McCarthy; June Schuette

[57] ABSTRACT

A printed circuit card having a printed circuit board therein with ground contact pads. The printed circuit card is made of a conductive housing in which the printed circuit board resides. At least one ground contact clip is interfaced with both the ground contact pad on the printed circuit board and the conductive housing to complete a ground circuit for the printed circuit board and for protecting the connector against electromagnetic interference and electrostatic discharge. The ground clip further ensures that the printed circuit card has a high ground-to-signal ratio, thereby ensuring good data transmission through the card.

6 Claims, 3 Drawing Sheets

PRINTED CIRCUIT CARD HAVING A CONTACT CLIP FOR GROUNDING A PRINTED CIRCUIT BOARD FOUND THEREIN

FIELD OF THE INVENTION

This invention relates to printed circuit cards. More specifically, this invention relates to printed circuit cards having printed circuit boards with ground contact pads therein that complete a path to ground, thereby increasing the ground-to-signal ratio of the printed circuit card and protecting the printed circuit card from electromagnetic interference and electrostatic discharge problems.

BACKGROUND OF THE INVENTION

External electronic printed circuit cards are known in the art for providing electronic devices in which they are interfaced with additional stored memory and other electronic functionality. Printed circuit boards in these printed circuit cards typically contain memory chips and other electronic components which provide additional memory capabilities to the electronic device as desired. One such use for modern printed circuit cards is in the printer art wherein a modular printed circuit card provides additional "font" styles to the printer by interfacing the printed circuit card in a slot in the printer so that the printer can access the fonts in memory on the card when necessary. Thus, the printed circuit boards in printed circuit cards must properly function whenever the card is in use or else the printer will not print in the correct text format. In order for the electronic components on the printed circuit board to function properly and efficiently, the printed circuit board in the printed circuit card must be adequately grounded to earth.

If an adequate ground is not provided to the printed circuit board, various problems arise during operation of the card, and therefore during operation of the device in which the card is interfaced. It is thus generally desirable to increase the ground-to-signal ratio in a printed circuit card so as to improve the signal flow therethrough to improve the signal transmission performance of the card.

Apart from the obvious signal transmission problems encountered when printed circuit boards in printed circuit cards are not adequately grounded, when a poor ground connection is made the printed circuit card usually suffers from electromagnetic interference (EMI) problems, and the deleterious effects of electrostatic discharge (ESD) which occur when electronic components on the card are to the card's housing or casing.

There have been many arrangements proposed in the art to provide a good ground path between the printed circuit board in the printed circuit card and earth. For example, U.S. Pat. No. 5,288,247, Kaufman, assigned to the same assignee as the present invention, proposes a ground referencing plane for a printed circuit board in a printed circuit card that provides a low impedance return path to increase the ground-to-signal ratio of the card. A conductive shroud further covers the card's housing and provides a ground reference plane via the top plate of the housing. The ground plane protects the printed circuit card from EMI or ESD since a mounting bracket electrically connects the ground plane of the printed circuit card to a ground plane on the printed circuit board such that ESD or EMI induced voltages are shunted electrically though the mounting bracket to the ground plane on the printed circuit board.

While the arrangement disclosed in the Kaufman patent is an excellent construction for reducing the effects of EMI or ESD, providing mounting-brackets to both hold a printed circuit board in a printed circuit card and to ground the printed circuit board can be costly. Furthermore, this arrangement does not consistently ensure that the ground contact between the printed circuit board and the housing is complete, and therefore a poor ground-to-signal ratio will sometimes be achieved.

Ground clips for grounding computer system boards have also been proposed in the art. See, for example, U.S. Pat. No. 5,138,529, Colton et al. The Colton et al. patent teaches a supportive grounding clip for mounting a computer system board to a conductive computer chassis. The clip includes a base member for providing a ground connection with the computer chassis, and flexible support members attached to opposite ends of the base member for mounting the supportive ground clip to the computer system board.

The supportive ground clip of the Colton et al. patent is rather large, and must be fitted through an elliptical opening in the base of the chassis to grasp the chassis so that the computer system board can be grounded to it. In this fashion, the clip provides support for the computer system board, as the board's weight tends to urge the board against the chassis. The clip of the Colton et al. patent is not adapted to provide protection against electromagnetic interference or electrostatic discharge, and further, can only function with the rather large computer motherboards typically found in personal computers. Furthermore, this clip possess a complicated shape in order to accommodate the weight-bearing requirements which the clip is meant to fulfill.

Prior printed circuit cards are therefore not consistently adequately grounded by the grounding arrangements which have heretofore been employed. There exists a long-felt need in the art for mechanisms to provide consistent ground contact points in printed circuit cards to protect the printed circuit cards from EMI and ESD problems, and to provide a high ground-to-signal ratio for the cards. These needs have not heretofore been fulfilled in the art.

SUMMARY OF THE INVENTION

The aforementioned problems are solved by printed circuit cards provided in accordance with the present invention. In a preferred embodiment, the printed circuit cards comprise a printed circuit board having a ground contact pad, a conductive housing in which the printed circuit board resides, and a ground contact clip interfaced to both the ground contact pad on the printed circuit board and the conductive housing completing a ground circuit for the printed circuit board, thereby protecting the connector against electromagnetic interference and electrostatic discharge. More preferably, the printed circuit board in the printed circuit card comprises at least two ground contact pads, one ground contact pad positioned on a top surface of the printed circuit board and one ground contact pad positioned on a bottom surface of the printed circuit board.

Even more preferably, the ground contact clip comprises a hingeable base member, first and second resilient ground contact pad interfaces extending laterally from the hingeable base member wherein at least the first resilient ground contact pad interface is in electrical contact with one of the ground contact pads, and first and second resilient housing interfaces formed from the lateral ends of the first and second ground contact pad interfaces, the first and second resilient housing interfaces in electrical contact with the conductive housing for completing the ground path between the ground contact pads and earth.

In a preferred aspect of the invention, the ground contact clip also comprises a first arcuate extending member, extending from the first resilient ground contact pad interface to terminate the first resilient ground contact pad interface, and to begin the first resilient housing interface. A second arcuate extending member is provided, extending from the second resilient ground contact pad interface to terminate the second resilient ground contact pad interface and to begin the second resilient housing interface.

In still further preferred embodiments, the ground contact clip comprises 303 full hard stainless steel, and has dimensions between 0.005 inches and 0.007 inches thick, and between 0.060 inches and 0.080 inches wide. The conductive housing further also comprises stainless steel.

Printed circuit cards and ground contact clips provided in accordance with the present invention ensure a good ground path between the printed circuit board and earth. Thus, the printed circuit cards claimed and described herein are protected from EMI and ESD problems. Furthermore, a good ground-to-signal ratio is ensured when the ground contact clip grasps the printed circuit board and the conductive housing, and therefore excellent data transmission is achieved for the electronic printed circuit card. Such results have not heretofore been achieved in the art.

The invention will be best understood with reference to the following Detailed Description of Preferred Embodiments read in conjunction with the drawings which are first described briefly below.

DETAILED DESCRIPTION OF PREFERRED EMBODIMENTS

Figure 1:
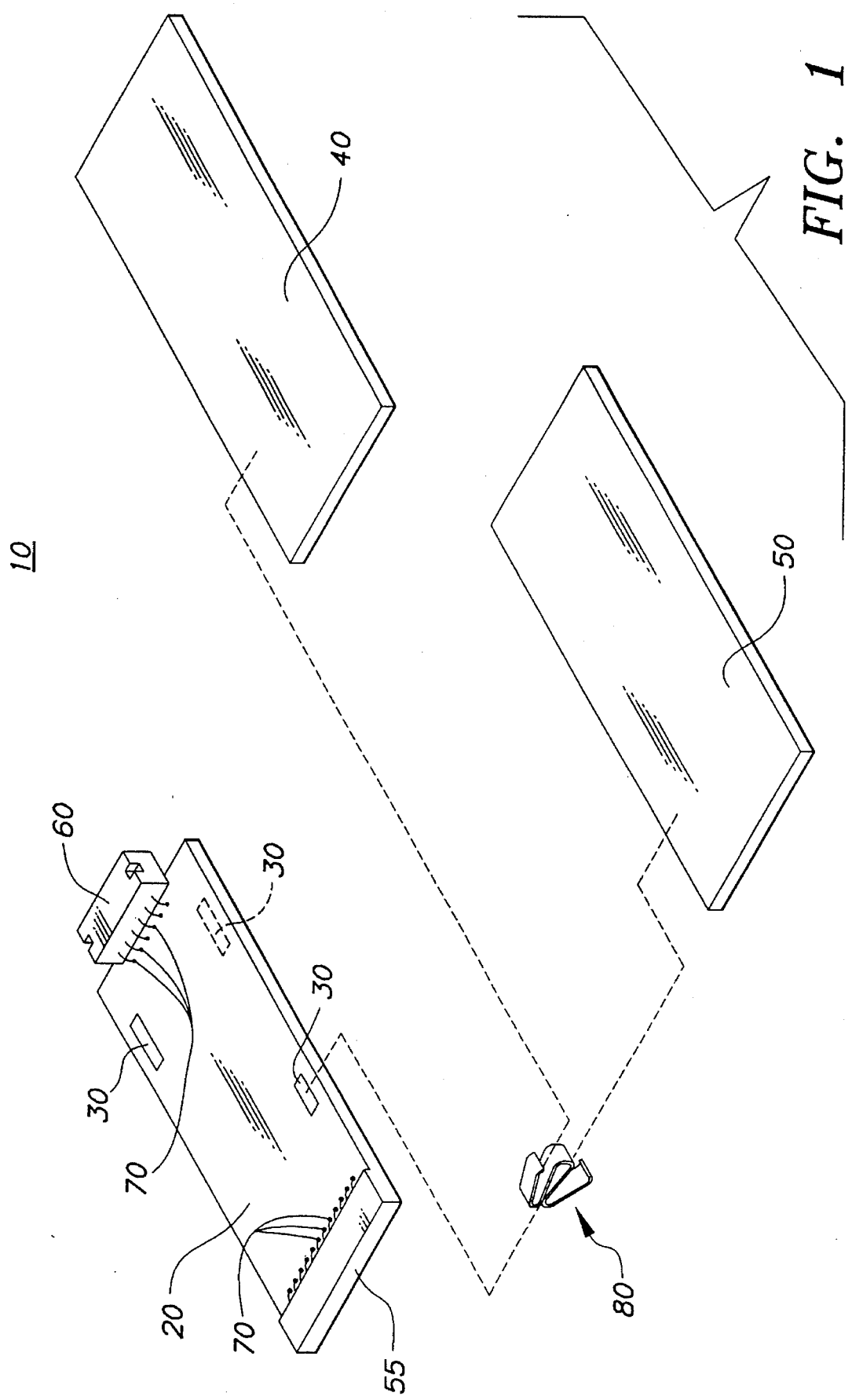
FIG. 1 is an exploded, isometric view of a printed circuit card provided in accordance with the present invention having a ground contact clip interfaced with ground contact pads on a printed circuit board in the printed circuit card.

Referring now to the drawings wherein like reference numerals refer to like elements, a printed circuit card 10 provided in accordance with the present invention is shown in FIG. 1. Preferably, the printed circuit card 10 complies with the standards promulgated by the Personal Computer Printed Memory Card International Association (PCMCIA) and therefore can be interfaced in any electronic device which requires external memory or additional electronic functionality that will be provided by the printed circuit card 10. Printed circuit card 10 preferably further comprises a printed circuit board 20. Electronic components (not pictured in FIG. 1) are mounted on the printed circuit board 20 to provide the electronic memory and other functionalities required for the particular application in which printed circuit card 10 will be employed.

More preferably, printed circuit board 20 comprises a plurality of ground contact pads shown at 30 which are interfaced with a ground plane in the substrate of printed circuit board 20. The ground contact pads 30 provide an electrical connection to the ground plane or planes in printed circuit board 20 and, as known by those with skill in the art, the individual components on the printed circuit board 20 are interfaced through the ground contact pads with the ground plane in the printed circuit board. More than one ground contact pad may be placed at any convenient location on the printed circuit board 20. Additionally, ground contact pads may be placed on both the upper and lower surfaces of printed circuit board 20 as needed.

Even more preferably, a conductive housing is provided to the printed circuit card 10. The conductive housing comprises a top cover 40 made of stainless steel, and a bottom cover 50, also made of stainless steel. Those with skill in the art will recognize that other mechanical structure will complete the printed circuit card 10, such as a card guide for holding the printed circuit board 20 in the printed circuit card 10, mounting brackets for mounting the printed circuit board 20 to the card guide, and various fasteners and flanges for securing the printed circuit board therein. The construction of a typical PCMCIA printed circuit card is completely described in the aforementioned Kaufman patent, U.S. Pat. No. 5,288,247, the teachings of which are specifically incorporated herein by reference.

Printed circuit card 10 also further comprises input/output connectors interfaced to the printed circuit board 20 so that data can be bussed through the card. A first input/output connector 55 provides an interface to the electronic components on printed circuit board 20. A second input/output connector 60 also provides an interface to the electronic components on the printed circuit board 20 so that data can be bussed from the printed circuit card 10 to the external electronic device. Both input/output connectors 55 and 60 are typically wave soldered or otherwise electrically connected to the printed circuit board 20 at contacts, shown at 70, so that the full electronic functionality of the printed circuit card 10 is achieved.

In accordance with a preferred aspect of the invention, a ground contact clip 80 is interfaced to at least one of the ground contact pads 30 on the printed circuit board 20. The ground contact clip 80 is a small, conductive member which has resilient interfaces that grasp the ground contact pad in preferably at least two locations. Clip 80 is further preferably electrically interfaced with both the top cover 40 and bottom cover 50 so that a ground path is established from the ground plane in printed circuit board 20 through the ground contact pad 30 and clip 80 to the conductive housing made up of the top and bottom covers, and ultimately to earth. Since ground contact clip 80 is made of a resilient conductive material, a sturdy and consistent connection between the ground plane in printed circuit board 20 and earth is established.

Ground contact clip 80 is placed in mechanical engagement with top and bottom covers 40 and 50 respectively when the top and bottom covers are joined to form the conductive housing of printed circuit card 10. In this fashion, the top and bottom covers are frictionally engaged with ground contact clip 80 which further causes ground contact clip 80 to frictionally engage the ground contact pad 30 and printed circuit board 20 so that a good electrical interface is achieved. The ground contact pad 30 thus completes the ground circuit for the printed circuit board 20. Since ground contact clip 80 makes a highly efficient ground connection for the entire printed circuit card 10, the printed circuit card is protected against EMI and ESD and a high ground-to-signal ratio for card 10 is achieved.

Figure 2:
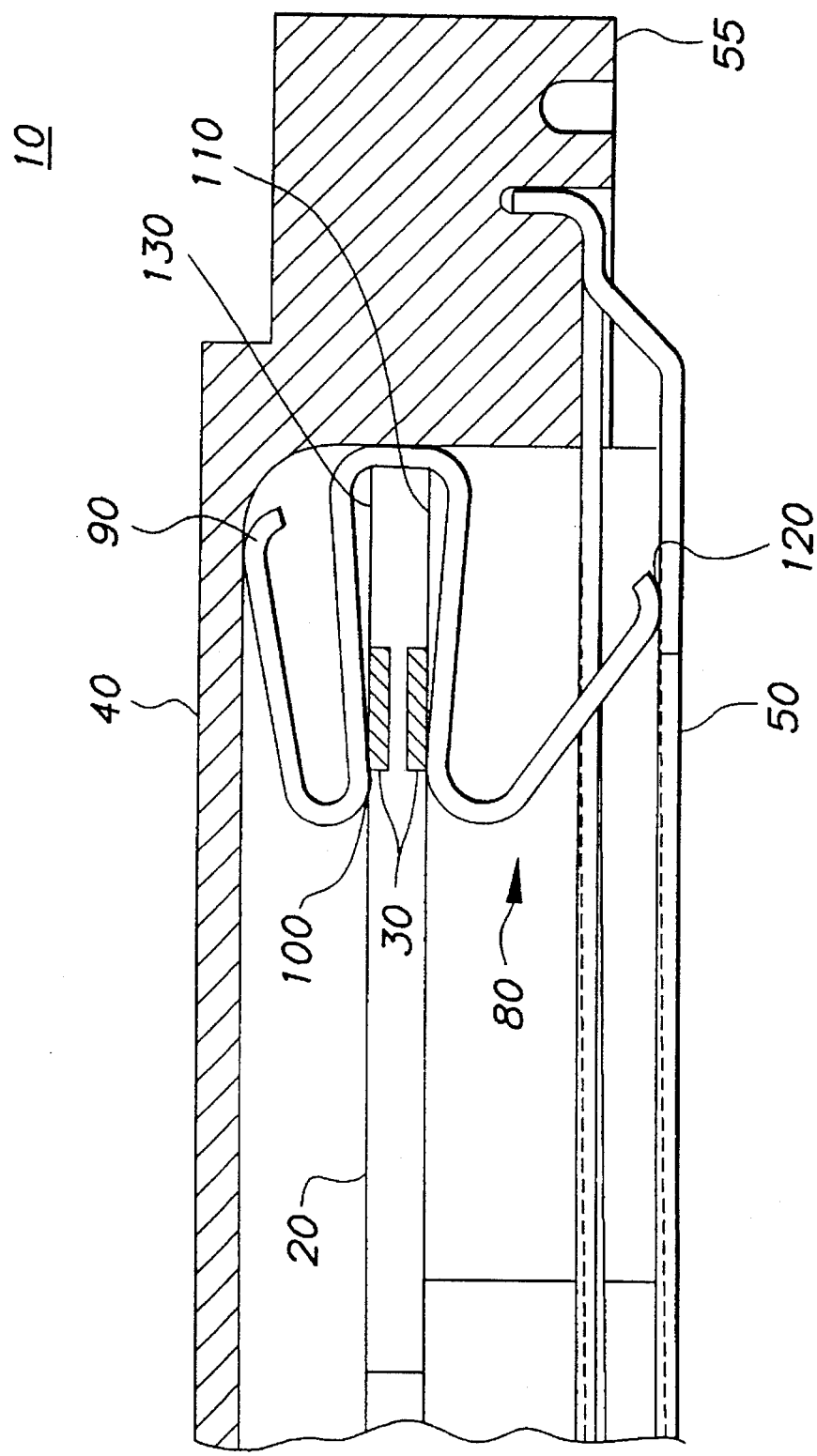
FIG. 2 is a cross-sectional, elevational view of the printed circuit card of FIG. 1.

Referring to FIG. 2, a cross-sectional view of printed circuit card 10 shows the ground contact clip 80 securely positioned therein for grounding printed circuit board 20 to top and bottom covers 40 and 50 respectively. In a preferred embodiment, the ground contact clip 80 makes four physical contact points in the printed circuit card 10. A first connection 90 is made on the inside surface of conductive top cover 40. A second connection 100 is made at a ground contact pad 30 of printed circuit board 20. Similarly, a third connection 110 is made at a second ground contact pad 30 formed on the bottom of the printed circuit board. Finally, a fourth connection 120 is made by the ground contact clip 80 on the inside surface of the bottom cover 50.

The four contact points ensure that an adequate ground path is made from the conductive housing to the ground plane of printed circuit board 20. Thus, with the arrangement of ground contact clip 80 as shown in FIGS. 1 and 2, a high ground-to-signal ratio is achieved, and both EMI and ESD protection for the printed circuit card are ensured. As can be seen at 130, a lateral end of the ground contact clip 80 securely fits around printed circuit board 20 so that the four contact points can be made. Therefore, since ground contact clip 80 is configured to grasp the edge of printed circuit board 20, the ground contact clip consistently makes the four ground connections shown most clearly in FIG. 2.

It will be appreciated that ground contact clip 80 is formed of a conductive material and in any size appropriate to grasp printed circuit board 20, depending on the thickness of the printed circuit board. For applications where ground contact clip 80 is to be used in a PCMCIA printed circuit card, it is preferred that ground contact clip 80 be made of 303 full hard stainless steel, and have dimensions of between 0.005 inches and 0.007 inches thick, and between 0.060 inches and 0.080 inches wide. Although these are the preferred dimensions and material composition of ground contact clip 80, those with skill in the art will further appreciate that other conductive materials and dimensions can be utilized depending upon the particular application in which ground contact clip 80 is to be employed.

Figure 3:
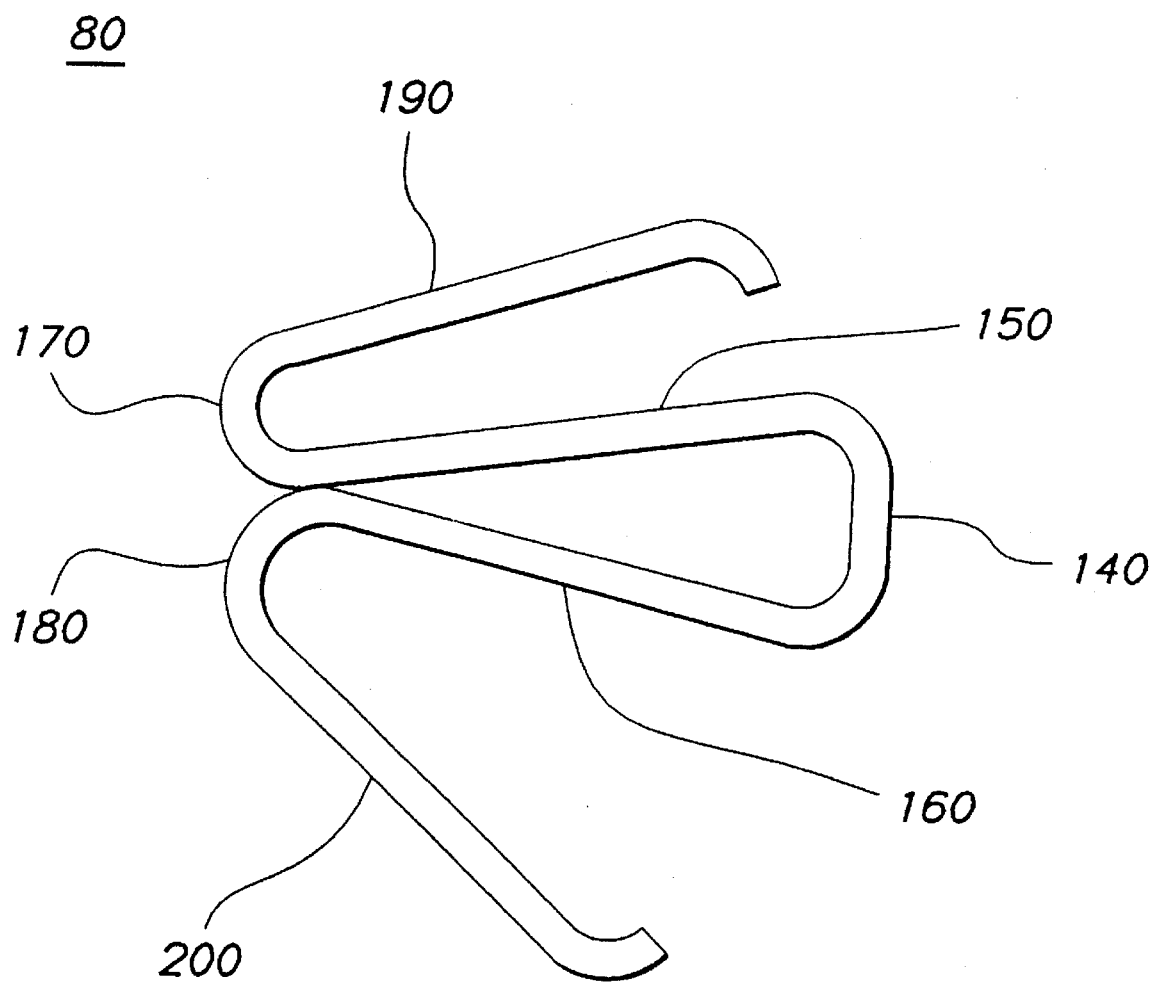
FIG. 3 is a plan view of a ground contact clip provided in accordance with the present invention.

Now referring to FIG. 3, more preferably the ground contact clip 80 comprises a hingeable base member 140 which is sufficiently resilient to expand under force to grasp printed circuit board 20. The ground contact clip 80 further comprises a first resilient ground contact pad interface 150 which extends laterally from the hingeable base member and which mechanically engages with a first ground contact pad on the printed circuit board 20 as the clip 80 grasps the printed circuit board 20. Similarly, a second resilient ground contact pad interface 160 extends laterally in the same direction from the hingeable base member 140 and mechanically engages with a second ground contact pad on a bottom portion of the printed circuit board 20.

A first arcuate extending member 170 and a second arcuate extending member 180 each extend from the first and second resilient ground contact pad interfaces respectively. The first and second extending members 170 and 180 serve to terminate the first and second resilient ground contact pad interfaces, and to begin the portions of the ground contact pads which will interface with the conductive housing.

Thus as shown, a first resilient housing interface 190 extends from the lateral end of the first resilient ground contact pad interface 150 which is terminated by the first arcuate extending member 170 and is provided to make contact with the inside portion of the top cover 40 of the housing. Similarly, a second resilient housing interface 200 formed from the lateral end of the second resilient ground contact pad interface 160 which has been terminated by the second arcuate extending member 180 is provided to make contact with the inside portion of the bottom cover 50 of the conductive housing. It can therefore be seen that the four contact points for grounding are made by ,the first and second resilient ground contact pad interfaces 150 and 160, and the first and second resilient housing interfaces 190 and 200 as the printed circuit board 20 is grasped by the hingeable base member 140.

Since ground contact clip 80 is preferably formed of 303 full hard stainless steel, it possess resiliency so that the hingeable base member 140 and resilient interfaces described above can grasp circuit boards of varying thicknesses. It is preferred that as each of the resilient interfaces mechanically engage the particular portions of the printed circuit board at the ground contact pads or the conductive housing, 200 and 300 grams of normal force be applied at each of the interfaces so that a good contact point is made thereon. To achieve the appropriate amount of contact force, both the hingeable base member 140 and arcuate members 170 and 180 must be sufficiently resilient so that interfaces 150, 160, 190 and 200 are properly engaged at the ground contact points.

In a PCMCIA circuit card having a printed circuit board therein as substantially shown above, the ground contact clip 80 can be configured by modifying the resiliency of arcuate members 170 and 180 to achieve good ground contact points. Thus, it is preferable that second resilient housing interface 200 be initially configured at a larger angle with respect to the printed circuit board 20, while first resilient housing interface 190 be initially configured at a shallower angle. The angles made by first and second resilient housing interfaces 190 and 200 can be tailored for the particular printed circuit board to be used in the printed circuit card, and for the particular dimensions which will be made by the conductive housing with respect to the position of the printed circuit board found in the card.

Generally, when printed circuit board 20 resides in the housing closer to the top cover 40, the angle made by second resilient housing interface 200 will be larger, and therefore the resiliency of arcuate extension member 180 will be greater than the resiliency of arcuate extension member 170. Since ground contact clip 80 will typically be made by a stamping machine, the resilience of the various members thereon can be controlled. Therefore, the configuration of ground contact clip 80 is versatile, and will find use in any printed circuit card which has a printed circuit board positioned in the card.

Printed circuit cards *in accordance with the present invention having ground contact clips for providing a ground path to the card consistently and advantageously achieve protection for the card against EMI and ESD. Furthermore, the ground contact clips described herein provide a high ground-to-signal ratio for the printed circuit card, thereby ensuring good data communication therethrough at all times during use. The disclosed ground contact clips are versatile, can be used in any situation where a ground contact must be made, and are adaptable for use in printed circuit cards or other devices having printed circuit boards of varying dimensions. Further, the ground contact clips and printed circuit cards provided in accordance with the invention are easy to install and inexpensive to manufacture. Such results have not heretofore been achieved in the art, and solve long-felt needs for printed circuit cards that achieve excellent ground-to-signal ratios, and which are protected against EMI and ESD.

There have thus been described certain preferred embodiments of printed circuit cards having ground contact clips provided in accordance with the present invention. While preferred embodiments have been described and disclosed, it will be recognized by those with skill in the art that modifications are within the true spirit and scope of the invention. The appended claims are intended to cover all such modifications.

What is claimed is:

1. A printed circuit card of the type having a printed circuit board with ground contact pads, input/output connector interfaces, and a housing made of a conductive material to provide an earth ground path for the printed circuit board through the ground contact pads thereon, the improvement comprising a ground contact clip interfaced to the ground contact pads and conductive housing, the ground contact clip further comprising, a hingeable base member, first and second resilient ground contact pad interfaces extending laterally from the hingeable base member wherein at least the first resilient ground contact pad interface is in electrical contact with one of the ground contact pads; and first and second resilient housing interfaces formed from the lateral ends of the first and second resilient ground contact pad interfaces, the first and second resilient housing interfaces in electrical contact with the conductive housing for completing the ground path between the ground contact pads and earth.

2. The printed circuit card recited in claim 1 wherein the ground contact clip further comprises:

a first arcuate extending member extending from the first ground contact pad interface to terminate the first resilient ground contact pad interface, and to begin the first resilient housing interface; and a second arcuate extending member extending from the second resilient ground contact pad interface to terminate the second resilient ground contact pad interface and to begin the second resilient housing interface.

3. The printed circuit card recited in claim 2 wherein the ground contact clip makes four ground contact points in the printed circuit card.

4. The printed circuit card recited in claim 3 wherein the housing comprises a top and bottom portion and the first resilient ground contact pad interface is in mechanical engagement with one of the ground contact pads on a top surface of the printed circuit board and the first resilient housing interface is in mechanical engagement with the top portion of the conductive housing.

5. The printed circuit card recited in claim 4 wherein the ground contact clip comprises 303 full hard stainless steel.

6. The printed circuit card recited in claim 5 wherein the ground contact clip is between 0.005 inches and 0.007 inches thick, and 0.060 inches and between 0.080 inches wide.

* * * * *